US007547932B2

(12) United States Patent
Zhang et al.

(10) Patent No.: US 7,547,932 B2
(45) Date of Patent: Jun. 16, 2009

(54) VERTICAL GATE-DEPLETED SINGLE ELECTRON TRANSISTOR

(75) Inventors: Yaohui Zhang, Los Angeles, CA (US);
Filipp A. Baron, Los Angeles, CA (US);
Kang L. Wang, Santa Monica, CA (US)

(73) Assignee: The Regents of the University of California, Oakland, CA (US)

( * ) Notice: Subject to any disclaimer, the term of this patent is extended or adjusted under 35 U.S.C. 154(b) by 1280 days.

(21) Appl. No.: 10/302,635

(22) Filed: Nov. 22, 2002

(65) Prior Publication Data

US 2009/0127543 A1 May 21, 2009

(51) Int. Cl.
*H01L 27/108* (2006.01)

(52) U.S. Cl. .................. 257/281; 257/192; 257/263; 257/280; 257/623

(58) Field of Classification Search ............. 257/23, 257/24, 20, 192, 263, 280, 281, 623
See application file for complete search history.

(56) References Cited

U.S. PATENT DOCUMENTS 4,459,605 A * 7/1984 Rice .................. 257/263
5,559,343 A * 9/1996 Kiehl .................. 257/23
6,211,531 B1 * 4/2001 Nakazato et al. ......... 257/263

OTHER PUBLICATIONS

Aassime, A., et al., Radio-Frequency Single-Electron Transistor as Readout Device for Qubits: Charge Sensitivity and Backaction, *Physical Review Letter*, vol. 86, No. 15, APS, Apr. 9, 2001, pp. 3376-3379.

Austing, D.G., et al., GaAs/AlGaAs/InGaAs Vertical Triple Barrier Single Electron Transistors, *Japanese Journal of Appl. Phys.*, Part I, vol. 36, (No. 3B), (1996 International Conference on Solid State Devices and Materials (SSDM'96), Yokohama, Japan , Aug. 26-29, 1996) Publication Office, Mar. 1997, pp. 1667-1671.

Austing, D.G., et al., Manipulation of the lateral potential geometry of a quantum dot located in a multiple gated vertical single electron transistor, *Physica E.*, vol. 2, (No. 1-4), [Eighth International Conference on Modulated Semiconductor Structures. MMS8, Santa Barbara, CA, USA, Jul. 14-18, 1997] Elsevier, Jul. 15, 1998, pp. 583-587.

(Continued)

*Primary Examiner*—Ori Nadav
(74) *Attorney, Agent, or Firm*—Gates & Cooper LLP

(57) ABSTRACT

A vertical gate-depleted single electron transistor (SET) is fabricated on a conducting or insulating substrate. A plurality of lightly doped basic materials and tunneling barriers are fabricated on top of a substrate, wherein at least two of the layers of basic materials sandwich the layers of tunneling barriers and at least two of the layers of tunneling barriers sandwich at least one of the layers of basic materials. A mesa is fabricated on top of the layers of basic materials and tunneling barriers, and has an undercut shape. An ohmic contact is fabricated on top of the mesa, and one or more gate Schottky contacts are fabricated on top of the layers of lightly doped basic materials and tunneling barriers. A quantum dot is induced by gate depletion, when a source voltage is set as zero, a drain voltage is set to be less than 0.1, and a gate voltage is set to be negative. The depletion region expands toward the center of the device and forms a lateral confinement to the quantum well, wherein a quantum dot is obtained. Because the size of the quantum dot is so small, the Coulomb charging energy achieved is large enough to let the device operate at room temperature.

9 Claims, 4 Drawing Sheets

OTHER PUBLICATIONS

Kasai, S., et al., GaAs Single Electron Transistors and Logic Inverters Based on Schottky Wrap Gate Structures, (58th DRC. Conference Digest (Cat. No. OOTH8526), Device Research Conference, Denver, CO, USA, Jun. 19-21, 2000) Piscataway, NJ, USA: *IEEE 2000*, pp. 155-156.

Kim, D.H., et al., Single-electron transistor based on a silicon-on-insulator quantum wire fabricated by a side-wall patterning method, *Applied Physics Letters*, vol. 79, No. 23, Dec. 3, 2001, pp. 3812-3814.

Korotkov, A., Single-electron logic and memory devices, *International Journal of Electronics*, 1999, vol. 86, No. 5, Taylor & Francis, pp. 511-547.

Ono, Y., et al., Single-Electron Pass-Transistor Logic: Operation of its elemental circuit, (International Electron Devices Meeting 2000. Technical Digest. IEDM (Cat. No. OOCH37138), San Francisco, CA, USA, Dec. 10-13, 2000) Piscataway, NJ, USA: *IEEE 2000*, pp. 297-300.

Schon, G., et al., Reading-out the state of a qubit: an analysis of the quantum measurement process, *Physica C*, vol. 352, No. 1-4, (Mesoscopic Superconductivity MS 2000, Atsugi, Japan, Mar. 8-10, 2000) Elsevier, Apr. 2001, pp. 113-119.

Takahashi, Y. et al., Multigate single-electron transistors and their application to an exclusive-OR gate, *Applied Physics Letters*, vol. 76, No. 5, AIP, Jan. 31, 2000, pp. 637-639.

Tarucha, S., et al., Shell Filling and Spin Effects in a Few Electron Quantum Dot, *Physical Review Letters*, vol. 77, No. 17, Oct. 21, 1996, pp. 3613-3616.

Uchida, K., et al., Room-Temperature Operation of Multifunctional Single-Electron Transistor Logic, (International Electron Devices Meeting Dec. 10-13, 2000. Technical Digest. IEDM, San Francisco, CA, USA, Cat. No. OOCH37138) Piscataway, NJ, *IEEE 2000*, pp. 863-865.

Yamanaka, T., et al., A single-electron stochastic associative processing circuit robust to random background-charge effects and its structure using nanocrystal floating-gate transistors, *Nanotechnology*, vol. 11, No. 3, IOP Publishing, Sep. 2000, pp. 154-160.

\* cited by examiner

VERTICAL GATE-DEPLETED SINGLE ELECTRON TRANSISTOR

STATEMENT REGARDING FEDERALLY SPONSORED RESEARCH OR DEVELOPMENT

This invention was made with Government support by a DARPA Grant KK26. The Government may have certain rights in this invention.

BACKGROUND OF THE INVENTION

1. Field of the Invention

The invention relates to single electron transistors, and more particularly, to a vertical gate-depleted single electron transistor.

2. Description of the Related Art

There has been a trend in the semiconductor industry over the years to reduce device size. However, current technologies are rapidly approaching their limits for further reductions. As a result, single-electron transistors (SETs) have been proposed for further reductions. In SETs, switching operations are performed out using individual electrons, and the SETs can operate at very low voltages.

A vertical gate-depleted single electron transistor has been proposed in the publication: S. Tarucha, D. G. Austing, and T. Honda, Phys. Rev. Lett., 77, 3613 (1996), which publication is incorporated by reference herein. In this structure, the mesa is etched to a point just below the tunneling barrier, and the gate Schottky contact wraps the pillar containing the tunneling barriers. However, this structure makes the fabrication process very complicated.

What is needed is a fabrication process and device structure for vertical gate-depleted single electron transistors that are more simplified and compatible with standard silicon processes used by industry. The present invention satisfies that need.

SUMMARY OF THE INVENTION

The present invention describes a vertical gate-depleted single electron transistor (SET), fabricated on a conducting or insulating substrate. A plurality of layers of lightly doped basic materials and tunneling barriers are fabricated on top of a substrate, wherein at least two of the layers of basic materials sandwich the layers of tunneling barriers and at least two of the layers of tunneling barriers sandwich at least one of the layers of basic materials. A mesa is fabricated on top of the layers of basic materials and tunneling barriers, wherein the mesa has an undercut shape. An ohmic contact is fabricated on top of the mesa, and one or more gate Schottky contacts are fabricated on top of the layers of basic materials and tunneling barriers. An ohmic contact fabricated on a bottom of the substrate.

The substrate is silicon (Si), silicon on insulator (SOI) or gallium arsenide (GaAs); the basic materials are silicon (Si), gallium arsenide (GaAs), silicon germanium (SiGe), or indium gallium arsenide (InGaAs); and the tunneling barriers are silicon dioxide ($SiO_2$), gallium aluminum arsenide (GaAlAs), silicon germanium (SiGe) or aluminum indium arsenide (AlInAs). The type of tunneling barriers depend on the type of undoped basic materials used, and the tunneling barriers and basic materials may comprise silicon dioxide ($SiO_2$) on silicon (Si), gallium aluminum arsenide (GaAlAs) on gallium arsenide (GaAs), or aluminum indium arsenide (AlInAs) on indium gallium arsenide (InGaAs).

A quantum dot is induced by gate depletion, wherein a source voltage is set as zero, a drain voltage is set to be less than 0.1, and a gate voltage is set to be negative, so that a depletion region expands toward a center of the device and forms a lateral confinement to the quantum well, and a quantum dot is obtained within the quantum well.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Figure 1:
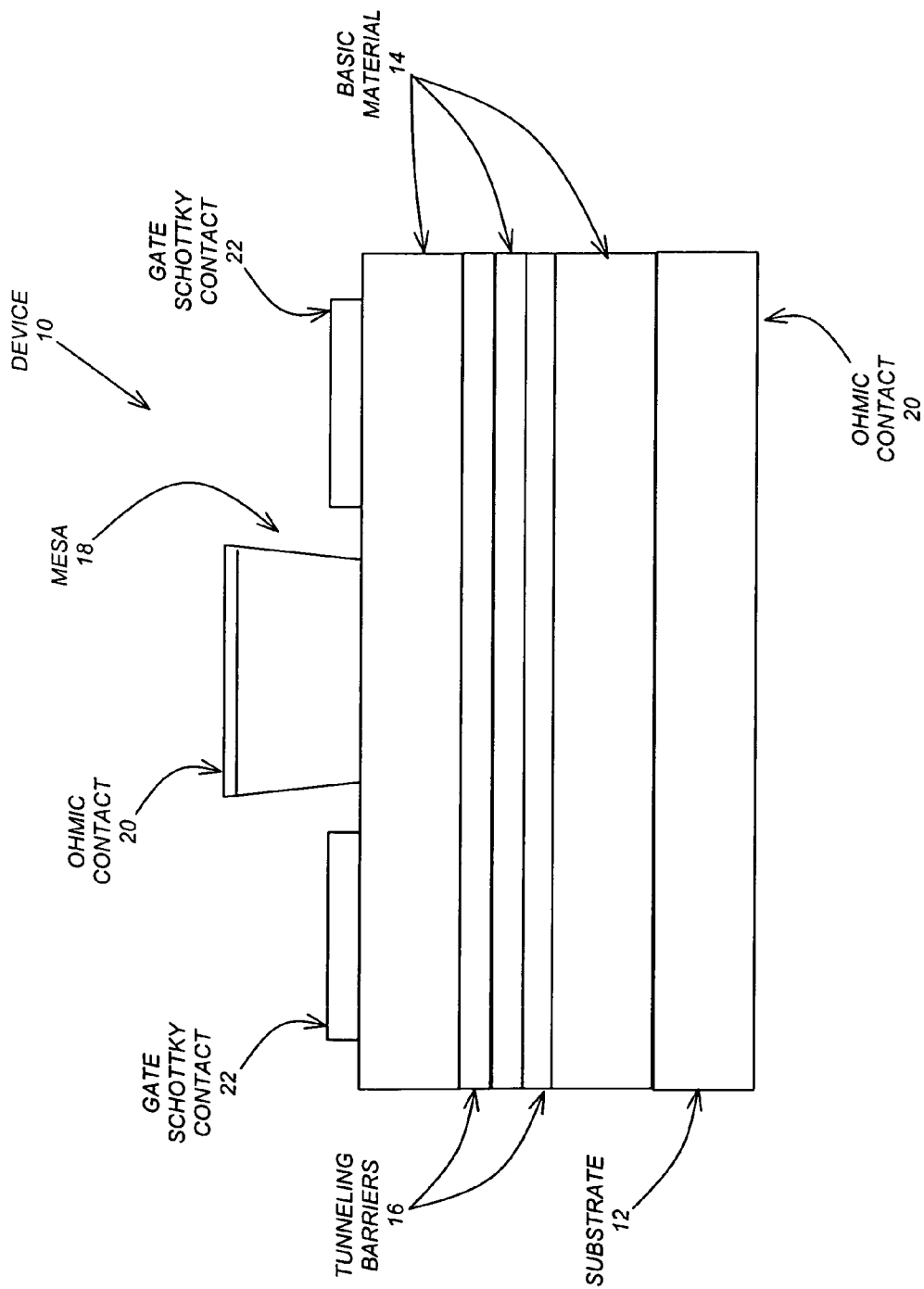
FIG. 1 illustrates a vertical gate-depleted single electron transistor (SET) device fabricated according to the preferred embodiment of the present invention.

FIG. 1 illustrates a vertical gate-depleted single electron transistor (SET) device 10 fabricated according to the preferred embodiment of the present invention. The device can be fabricated on a conducting or insulating substrate 12, such as Si (silicon), SOI (silicon on insulator) or GaAs (gallium arsenide), etc. The lightly doped basic materials 14 can be Si, GaAs, SiGe (silicon germanium), InGaAs (indium gallium arsenide), etc., or other materials. The tunneling barriers 16 can be $SiO_2$ (silicon dioxide), GaAlAs (gallium aluminum arsenide), SiGe, AlInAs (aluminum indium arsenide), etc., depending on the type of undoped basic materials used, for example, $SiO_2$ on Si, GaAlAs on GaAs, AlInAs on InGaAs, etc. The layer of basic materials 14 sandwiched between the two tunneling barriers 16 should be less than 10 nm (nanometers) thick. The mesa 18 is etched by a combined dry and wet etch to have an undercut shape, and it allows a self-alignment process to form an Ohmic contact 20 at the top of mesa 18 and gate Schottky contacts 22 simultaneously. An Ohmic contact 20 is also formed on the bottom of the substrate 12.

Figure 2:
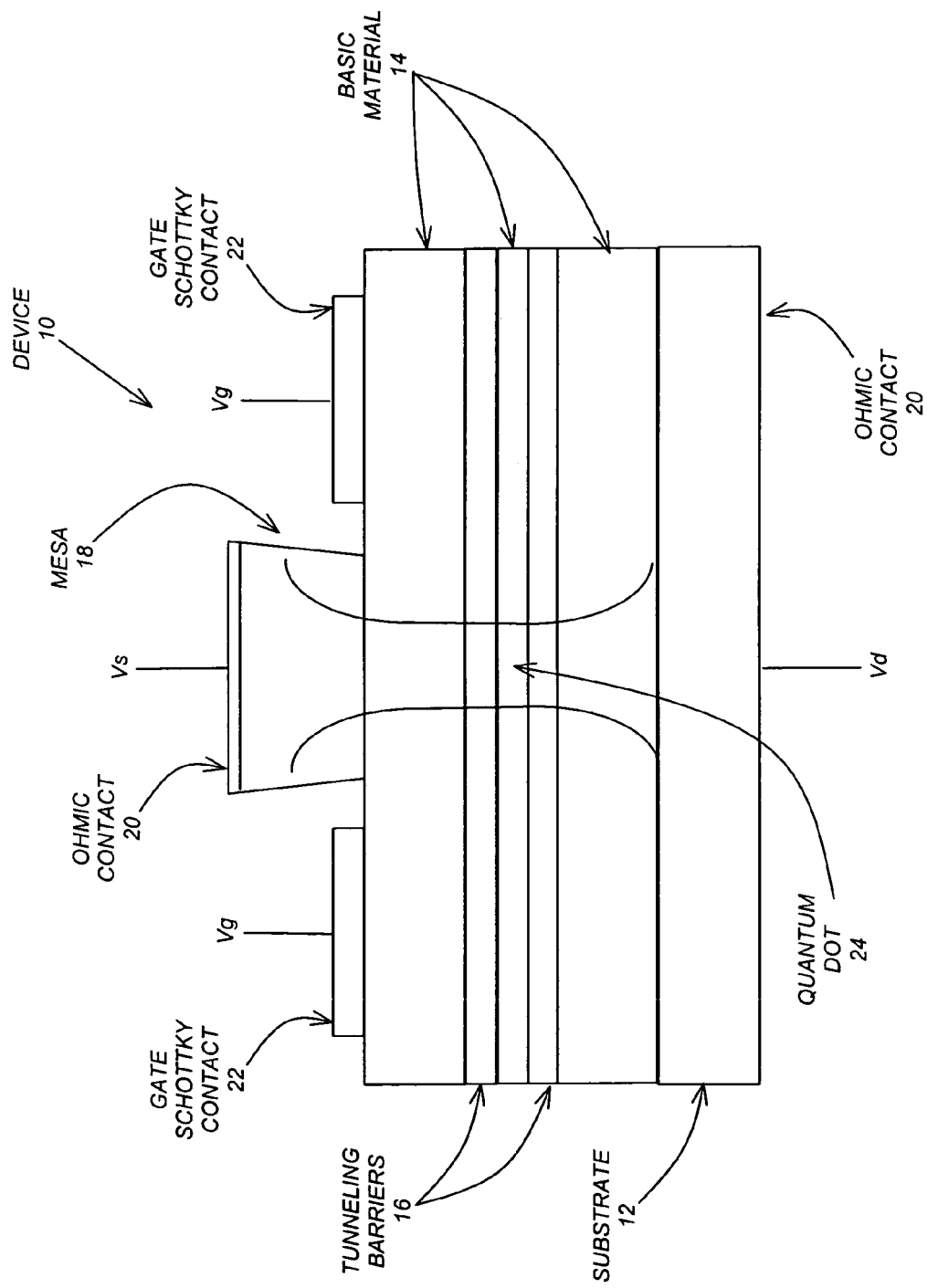
FIG. 2 illustrates how, in operation, a quantum dot is induced by gate depletion according to the preferred embodiment of the present invention.

FIG. 2 illustrates how, in operation, a quantum dot is induced by gate depletion according to the preferred embodiment of the present invention. Source voltage Vs is set as zero and drain voltage Vd is set to be less than 0.1. Then, gate voltage Vg is set to be negative, and then goes more negative. The depletion region expands toward the center of the device 10 and forms a lateral confinement to the quantum well. Thereafter, a quantum dot is obtained with a lateral size of 100~300 A (Angstroms). (This has been demonstrated by the simulation using a commercial device simulator, namely DESSIS 7.0.). Because the size of the quantum dot is so small, the Coulomb charging energy achieved is large enough to let the device 10 operate at room temperature.

Figure 3:
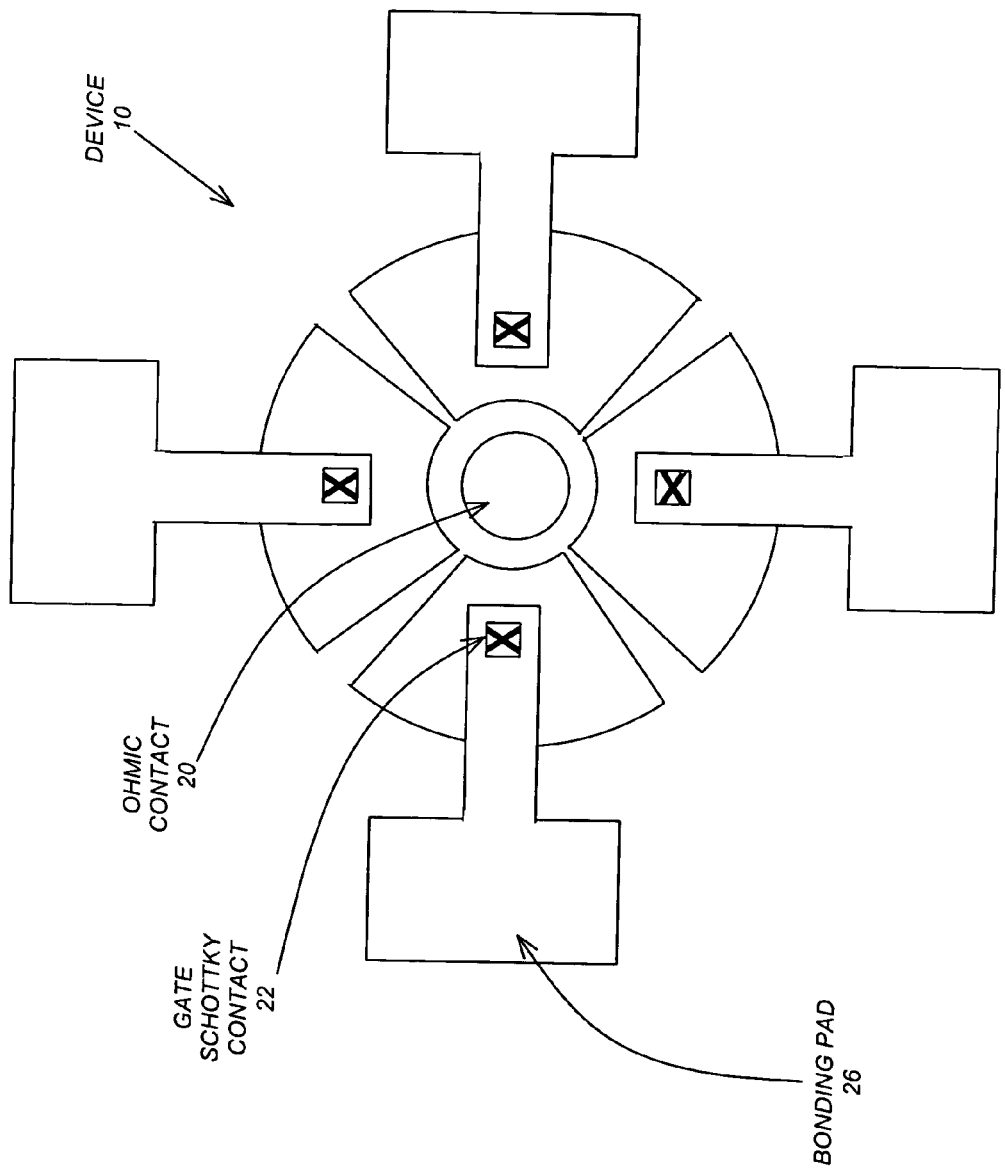
FIG. 3 is a top or eye view of the vertical gate-depleted single electron transistor (SET) device of FIGS. 1 and 2 according to the preferred embodiment of the present invention.

FIG. 3 is a top or eye view of the vertical gate-depleted single electron transistor device 10 of FIGS. 1 and 2 according to the preferred embodiment of the present invention. As shown in this figure, a single gate may be split into multiple gates, as indicated by the multiple gate Schottky contacts 22 surrounding the Ohmic contact 20 on top of the mesa 18. Further, bonding pads 26 are provided for each of the gate Schottky contacts 22.

The structure of FIG. 3 would be very useful in nanoelectronics, as well as cellular automata computer and multigate logics. For example, this structure makes it easier to interconnect more devices, and provide higher integration density and performance. Moreover, the split gate architecture is useful in applications described in the publication: Y. Takahashi, A. Fujiwara, K. Yamazaki, H, Namatus, K. Kurihara and K. Murase, Appl. Phys. Lett., 76, 637 (2000), which publication is incorporated by reference herein.

Figure 4:
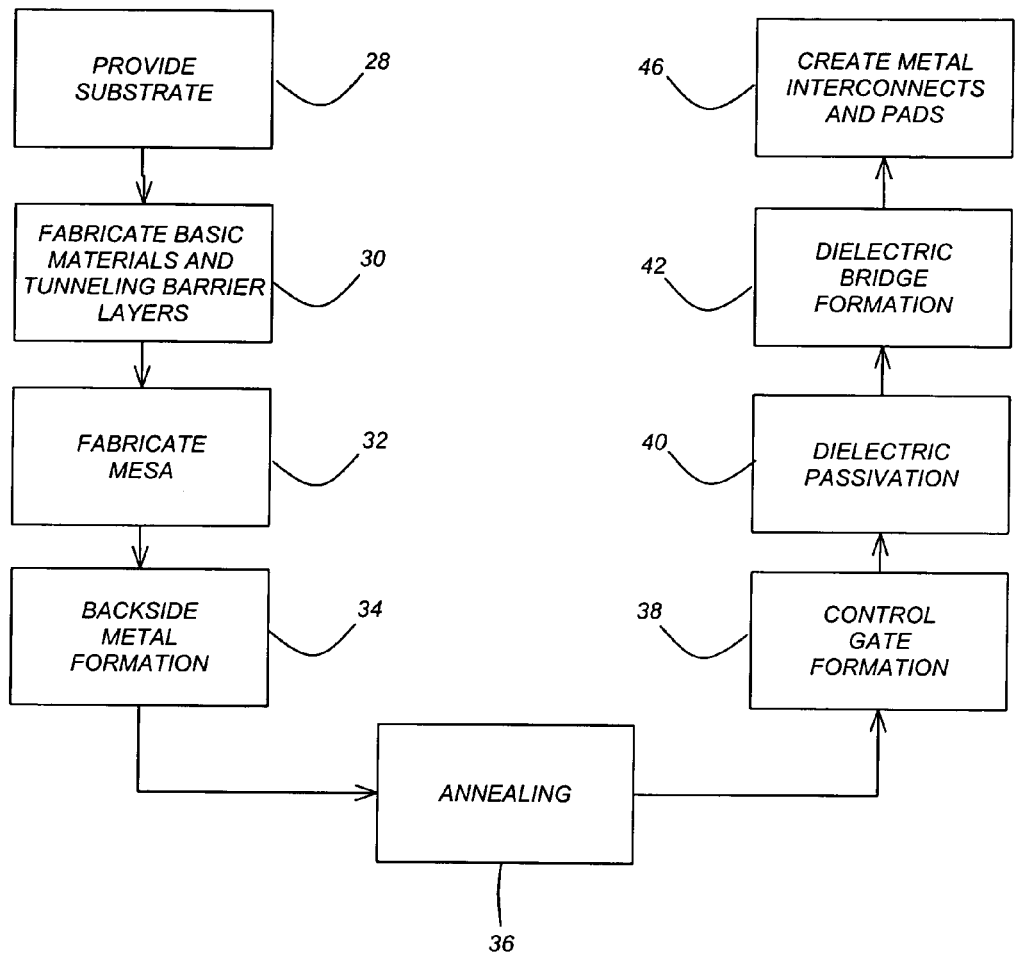
FIG. 4 is a flowchart describing a method of fabricating a vertical gate-depleted single electron transistor device, according to the preferred embodiment of the present invention.

FIG. 4 is a flowchart describing a method of fabricating a vertical gate-depleted single electron transistor device, according to the preferred embodiment of the present invention.

Block 28 represents a conducting or insulating substrate 12 being provided. Preferably, the substrate 12 is selected from a group consisting essentially of Si, SOI and GaAs.

Block 30 represents a plurality of layers of basic materials 14 and tunneling barriers 16 being fabricated on top of the substrate 12, wherein at least two of the layers of basic materials 14 sandwich the layers of tunneling barriers 16 and at least two of the layers of tunneling barriers 16 sandwich at least one of the layers of basic materials 14. Preferably, the basic materials 14 are selected from a group consisting essentially of Si, GaAs, SiGe, and InGaAs, and the tunneling barriers 16 are selected from a group consisting essentially of $SiO_2$, GaAlAs, SiGe and AlInAs. Specifically, the tunneling barriers 16 depend on the type of undoped basic materials 14 used, and thus the tunneling barriers 16 and basic materials 14 are selected from a group consisting essentially of $SiO_2$ on Si, GaAlAs on GaAs, and AlInAs on InGaAs.

Block 32 represents a mesa 18 being fabricated on top of the layers of basic materials 14 and tunneling barriers 16, wherein the mesa 18 has an undercut shape. In this step, there are four substeps: photolithography or e-beam lithography of the anode mask, metal deposition of Ti/Au/Ti (titanium/gold/titanium) (for 100A/1000A/300A), and lift off. From these substeps, a metal mask is created and dry etching using ICP (inductive coupled plasma) or DRIE (deep reactive ion etching) is then used to form the mesa 18 with a metal Ohmic contact 20 on top. Consequently, the metal serves both as a mask for dry etching and as an Ohmic contact 20 to the anode.

Block 34 represents the step of backside metal formation, i.e., the creation of the Ohmic contact 20 on the bottom of the device 10. In this step, metal deposition occurs using Ti/Au (for 100A/1000A).

Block 36 represents the step of annealing (if necessary) to form better Ohmic contacts 20.

Block 38 represents the step of control gate formation, i.e., the creation of the gate Schottky contacts 22 on top of the layers of lightly doped basic materials 14 and tunneling barriers 16. In this step, there are three substeps: photolithography or e-beam lithography of the control gate mask, metal deposition of Ti/Au/Ti (for 100A/1000A/300A) and then lift off. Moreover, this step may include splitting a single gate into a plurality of gates.

Block 40 represents the step of dielectric passivation. Three possible recipes exist:

1. $SiO_2$ or $Si_3N_4$ (silicon nitride) is deposited by plasma enhanced chemical vapor deposition (PECVD), followed by a chemical mechanical planarization (CMP) process to unveil the anode metal.
2. A photoresist coating is applied, and $O_2$ ashing performed to unveil the anode metal.
3. Spin-on-glass coating and backing is applied, followed by a CMP process to unveil the anode metal.

Block 42 represents the dielectric bridge formation to serve as a pedestal for the anode interconnects, i.e., the dielectric strip that supports the anode interconnect metal above the Schottky gates. In this step, there are two substeps: photolithography of the contact mask, and dielectric dry or wet etching.

Block 44 represents the step of creating metal interconnects and pads. In this step, there are three substeps: photolithography of the pad mask, metal deposition of Ti/Au (for 100A/2000A) and then lift off.

Conclusion

This concludes the description of the preferred embodiment of the invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A vertical gate-depleted single electron transistor device, comprising:
   a substrate;
   a plurality of layers of basic materials and tunneling barriers fabricated on top of the substrate, wherein at least two of the layers of basic materials sandwich the layers of tunneling barriers and at least two of the layers of tunneling barriers sandwich at least one of the layers of basic materials;
   a mesa fabricated on top of the layers of basic materials and tunneling barriers;
   an ohmic contact fabricated on top of the mesa; and
   one or more gate Schottky contacts fabricated on top of the layers of basic materials and tunneling barriers;
   wherein:
      a source voltage is applied to the ohmic contact and the source voltage is set as zero;
      a drain voltage is applied to the substrate and the drain voltage is set to less than 0.1;
      a gate voltage is applied to at least one of the gate Schottky contacts and the gate voltage is set as negative;
      so that a depletion region expands toward a center of the device and forms a lateral confinement to a quantum well and a quantum dot is obtained within the quantum well.

2. The device of claim 1, further comprising an ohmic contact fabricated on a bottom of the substrate.

3. The device of claim 1, wherein the substrate is silicon (Si), silicon on insulator (SOI) or gallium arsenide (GaAs).

4. The device of claim 1, wherein the basic materials are silicon (Si), gallium arsenide (GaAs), silicon germanium (SiGe), or indium gallium arsenide (InGaAs).

5. The device of claim 1, wherein the tunneling barriers are silicon dioxide ($SiO_2$), gallium aluminum arsenide (GaAlAs), silicon germanium (SiGe) or aluminum indium arsenide (AlInAs).

6. The device of claim 1, wherein the tunneling barriers and basic materials are silicon dioxide ($SiO_2$) on silicon (Si), gallium aluminum arsenide (GaAlAs) on gallium arsenide (GaAs), or aluminum indium arsenide (AlInAs) on indium gallium arsenide (InGaAs).

7. The device of claim 1, wherein the layer of basic materials sandwiched between the layers of tunneling barriers is less than 10 nm thick.

8. The device of claim 1, wherein the mesa has an undercut shape.

9. The device of claim 1, further comprising splitting a single gate of the device into a plurality of gates.

* * * * *

UNITED STATES PATENT AND TRADEMARK OFFICE
CERTIFICATE OF CORRECTION

PATENT NO. : 7,547,932 B2  
APPLICATION NO. : 10/302635  
DATED : June 16, 2009  
INVENTOR(S) : Zhang et al.

Page 1 of 1

It is certified that error appears in the above-identified patent and that said Letters Patent is hereby corrected as shown below:

Column 1

Lines 7-9, Under: STATEMENT REGARDING FEDERALLY SPONSORED RESEARCH OR DEVELOPMENT Delete: "This invention was made with Government support by a DARPA Grant KK26. The Government may have certain rights in this invention."

and;

Insert: --This invention was made with Government support under Grant No. MDA972-99-0017 awarded by the U.S. DOD/ADVANCED RESEARCH PROJECTS AGENCY (DARPA). The Government has certain rights in this invention.--

Signed and Sealed this

Twenty-fifth Day of August, 2009

David J. Kappos
*Director of the United States Patent and Trademark Office*